(12) United States Patent
Kramer

(10) Patent No.: US 7,279,920 B2
(45) Date of Patent: Oct. 9, 2007

(54) EXPEDITIOUS AND LOW COST TESTING OF RFID ICS

(75) Inventor: Bradley Allen Kramer, Dallas, TX (US)

(73) Assignee: Texas Instruments Incoporated, Dallas, TX (US)

( * ) Notice: Subject to any disclaimer, the term of this patent is extended or adjusted under 35 U.S.C. 154(b) by 61 days.

(21) Appl. No.: 11/100,040

(22) Filed: Apr. 6, 2005

(65) Prior Publication Data

US 2006/0226864 A1 Oct. 12, 2006

(51) Int. Cl.
*G01R 31/26* (2006.01)

(52) U.S. Cl. ...................................... 324/765

(58) Field of Classification Search ............ None
See application file for complete search history.

(56) References Cited

U.S. PATENT DOCUMENTS

| | | | | |
|---|---|---|---|---|
| 5,153,710 A | * | 10/1992 | McCain | 257/724 |
| 5,448,110 A | * | 9/1995 | Tuttle et al. | 257/723 |
| 5,497,145 A | * | 3/1996 | Yung et al. | 340/7.34 |
| 5,572,226 A | * | 11/1996 | Tuttle | 343/726 |
| 5,787,174 A | * | 7/1998 | Tuttle | 324/764 |
| 5,983,363 A | * | 11/1999 | Tuttle et al. | 324/605 |
| 6,357,025 B1 | * | 3/2002 | Tuttle | 714/724 |

* cited by examiner

*Primary Examiner*—Jermele Hollington
(74) *Attorney, Agent, or Firm*—William B Kempler; W. James Brady, III; Frederick J. Telecky, Jr.

(57) ABSTRACT

System and method for integrated circuit manufacturing. A preferred embodiment comprises transmitting a first set of data to integrated circuits (ICs) while they are in an on-wafer state and having each IC store the first set of data into memory, transmitting a second set of data to the ICs and having the ICs compare the second set of data with the first set of data stored in the memory, reading out the results of the comparisons, and marking an IC as being defective if the comparison indicates that that the first set of data did not match the second set of data. Each IC features an antenna formed in the scribe line region adjacent to the IC so that communications can take place while the IC remains on the wafer without the need to use electrical probes.

15 Claims, 4 Drawing Sheets

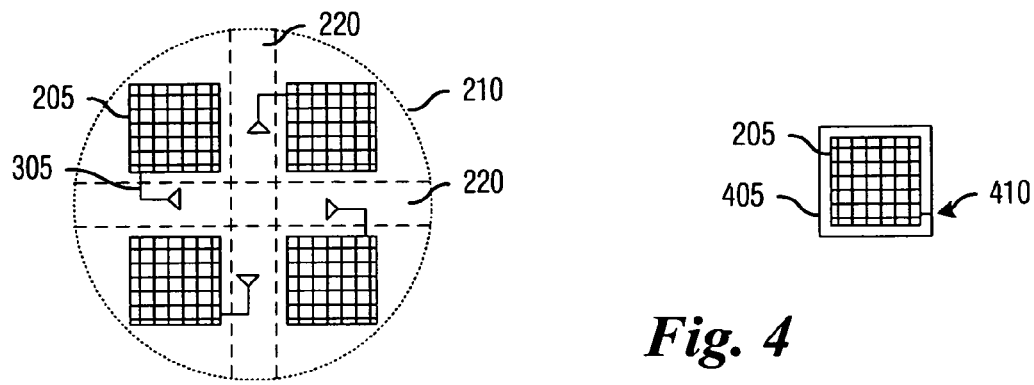
*Fig. 3*
*Fig. 4*
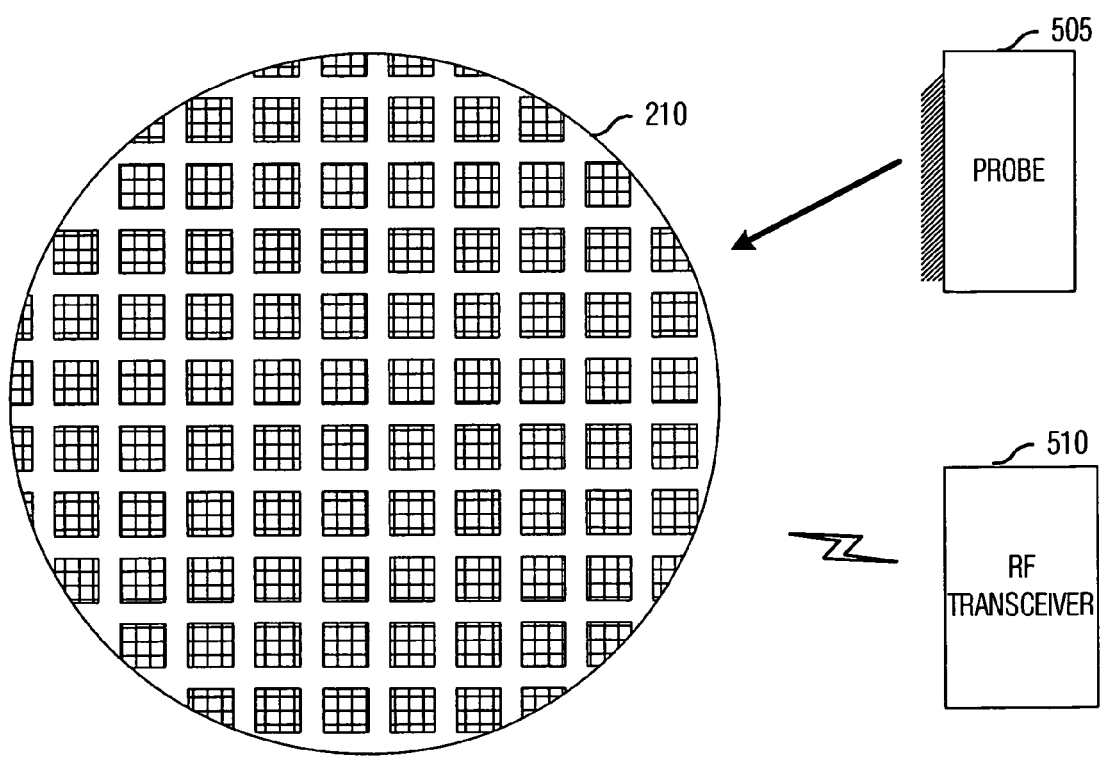
*Fig. 5*

EXPEDITIOUS AND LOW COST TESTING OF RFID ICS

TECHNICAL FIELD

The present invention relates generally to a system and method for integrated circuit manufacturing, and more particularly to a system and method for rapidly and inexpensively testing radio-frequency identification (RFID) integrated circuits.

BACKGROUND

The use of radio-frequency identification (RFID) devices has started to become more widespread since applications in retail sales, product manufacturing, shipping, traffic management, and so forth, have started to materialize. In many of these applications, large numbers of RFID tags, individual integrated circuits with antenna, are embedded into products to enable the tracking of the products. With the possible exception of traffic management, the RFID tags have an inherent requirement to be inexpensive, so as to not negatively affect the cost of the products in which they are embedded.

A factor in the overall cost of an integrated circuit (IC) is the testing that is performed on the IC. In general, a complete test of an IC will cost more than a simple functional test of the same IC. Furthermore, a test that takes an extended amount of time will result in a higher testing cost since additional testing facilities may be needed to meet production requirements.

A testing technique that can permit the testing of the integrated circuits is to use probes that can be lowered onto semiconductor wafers to provide electrical connectivity between the ICs on the wafer and the test equipment. With the connection made by the probes, the tests can be performed on the ICs to determine the properly operating ICs.

A disadvantage of the prior art is that the use of probes to test the ICs has limited capability in testing the RF performance of the ICs. Therefore, an additional test (or tests) may need to be performed to ensure that RF circuitry on the ICs is operating properly. The need for additional testing will increase the overall testing time, complexity, and cost and therefore increase the overall cost of the ICs. Additionally, the use of probes to test ICs requires a high degree of precision (in order to make proper contact on the ICs with the probes). Furthermore, probes are mechanical devices that are expensive and wear out with use.

SUMMARY OF THE INVENTION

These and other problems are generally solved or circumvented, and technical advantages are generally achieved, by preferred embodiments of the present invention which provides a system and method for rapidly and inexpensively testing RFID ICs.

In accordance with a preferred embodiment of the present invention, a method for testing on-wafer integrated circuits (ICs), wherein each on-wafer IC contains an antenna, is provided. The method comprises transmitting a first instruction and a first set of data to the on-wafer ICs, wherein the first instruction commands the on-wafer ICs to store the first set of data into memory, and transmitting a second instruction and a second set of data to the on-wafer ICs, wherein the second instruction commands the on-wafer ICs to compare the second set of data with the first set of data stored in memory. The method further comprises after the second transmitting, reading out results of the comparisons, and marking a status of each on-wafer IC based on the result of the comparison associated with the on-wafer IC being marked.

In accordance with another preferred embodiment of the present invention, a method for testing on-wafer integrated circuits (ICs), wherein each on-wafer IC contains an antenna and a memory, is provided. The method comprises transmitting a first instruction and a set of data to the on-wafer ICs, wherein the first instruction commands the on-wafer ICs to store the set of data into memory, and transmitting a transmit command to the on-wafer ICs. The method further comprises after the second transmitting, receiving the set of data from each on-wafer IC, comparing the set of data from each on-wafer IC with a copy of the set of data, and marking a status of each on-wafer IC based on the result of the comparison.

In accordance with another preferred embodiment of the present invention, an on-wafer integrated circuit (IC) made for on-wafer testing is provided. The on-wafer IC comprises an integrated circuitry portion containing circuitry to perform desired operations of the on-wafer IC, and an antenna coupled to the integrated circuitry portion, the antenna formed in a scribe line region of a semiconductor wafer, the antenna to permit circuitry in the integrated circuitry portion of the on-wafer IC to communicate prior to being cut out from the semiconductor wafer.

An advantage of a preferred embodiment of the present invention is that in a single test, the RF circuitry and non-RF circuitry of a RFID IC can be tested. Therefore, the cost of testing can be minimized.

A further advantage of a preferred embodiment of the present invention is that the single test can be implemented with a minor change to the layout of the ICs to enable the testing without increasing the cost of manufacture for the ICs. Therefore, the implementation of the present invention can be made with minimal investment in money and equipment.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a diagram of integrated circuits in an on-wafer state with antenna for each integrated circuit, according to a preferred embodiment of the present invention;

FIG. 4 is a diagram of an integrated circuit with an antenna after being cut out from the wafer, according to a preferred embodiment of the present invention;

FIG. 5 is a diagram of testing methodology for testing on-wafer integrated circuits, according to a preferred embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the production testing of RF and non-RF circuits in RFID tags. The invention may also be applied, however, to the testing of integrated circuits that feature RF circuitry in addition to non-RF circuitry without requiring the separate testing of the RF circuitry and the non-RF circuitry.

Figure 1:
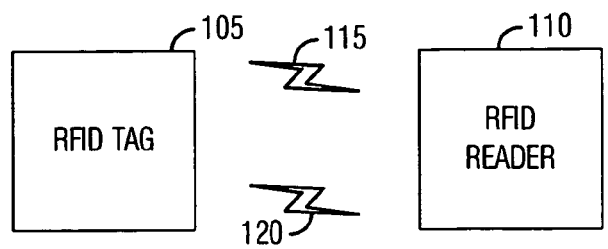
FIG. 1 is a diagram of a RFID tag and reader combination.

With reference now to FIG. 1, there is shown a diagram illustrating the operation of an RFID tag and reader combination. The diagram shown in FIG. 1 illustrates an RFID tag 105 and an RFID reader 110. The RFID reader 110 can be used to read information stored in the RFID tag 105 as well as instruct the RFID tag 105 to execute certain instructions and/or programs if the RFID tag 105 is enabled to do so.

The RFID tag 105 is a passive circuit that typically does not have its own power source, although in some applications, the RFID tag 105 can have its own power source. The RFID tag 105 typically needs to derive its power from RF signals 115 transmitted by the RFID reader 110. Transmissions by the RFID reader 110 can also carry instructions/commands and data for the RFID tag 105. After being powered, the RFID tag 105 can respond to the instructions/commands and data from the RFID reader 110 and possibly provide a response back to the RFID reader 110. The RFID tag 105 can transmit its response back to the RFID reader in the form of RF signals 120.

Figure 2:
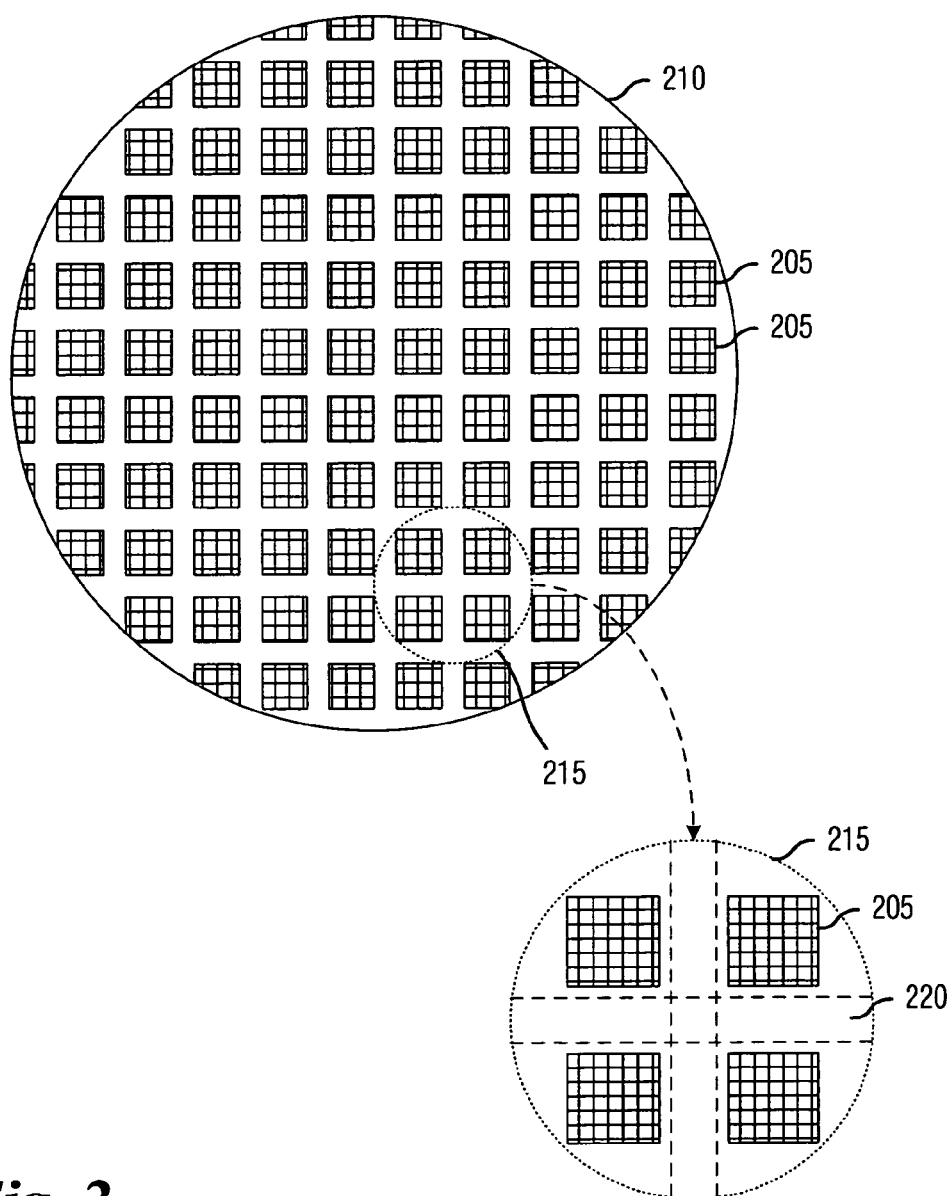
FIG. 2 is a diagram of integrated circuits in an on-wafer state.

With reference now to FIG. 2, there is shown a diagram illustrating integrated circuits on a wafer. An IC 205 used in RFID tags, like most other ICs, are fabricated along side a multitude of other ICs on a semiconductor wafer 210. The semiconductor wafer 210 is usually a circular piece of silicon on which multiple ICs are fabricated, in a layer by layer manner. The semiconductor wafer 210 usually contains multiple copies of a single IC, however, it is possible for the semiconductor wafer 210 to contain multiple IC designs.

Taking a closer inspection of a small section of the semiconductor wafer 210, there is shown a circular region 215 of the semiconductor wafer 210. The circular region 215, as displayed in FIG. 2, contains four ICs 205. In between each IC 205 is a region separating each IC. This region is commonly referred to as a scribe line 220. The scribe line 220 is used to provide a physical separation between each IC on the semiconductor wafer 210. The scribe line 220 is where a saw cuts to separate the individual ICs. Typically, no circuitry is formed within the scribe line 220 since the saw cuts would destroy anything in the scribe line 220. Note the diagram displays only some of the scribe lines and that there would be scribe lines around each of the ICs 205.

With reference now to FIG. 3, there is shown a diagram illustrating a portion of a semiconductor wafer, wherein an antenna is fabricated for each IC, according to a preferred embodiment of the present invention. The diagram shown in FIG. 3 shows a portion of the semiconductor wafer 210 with four ICs 205 that are separated from one another by scribe lines 220. Emanating from each IC 205 is an antenna 305, with the antenna 305 being created in the scribe line 220. According to a preferred embodiment of the present invention, the antenna 305 can be coupled to an antenna input pad (not shown) on the IC 205. The antenna input pad may be an input/output pad located on the IC 205 wherein after the IC 205 is packaged, an input/output pin can be coupled. The antenna 305 is fabricated in the scribe line 220 in such a way that after a saw is used to separate the ICs 205, the antenna 305 is substantially destroyed and can no longer function as a signal receiving device.

With reference now to FIG. 4, there is shown a diagram illustrating an IC 205 after it has been cut out from a semiconductor wafer, according to a preferred embodiment of the present invention. The IC 205, after being cut out from a semiconductor wafer should have a semiconductor substrate material region 405 encircling the IC 205. The semiconductor substrate material region 405 can be present to provide margin of error to help ensure that when a saw is used to cut out the IC 205, the IC 205 is not damaged by the saw. The IC 205 can also have a small antenna stub 410, all that remains of the antenna 305 (FIG. 3) after the IC 205 has been separated from the semiconductor wafer. The antenna stub 410 is typically of a sufficiently small size so that the antenna stub 410 is unable to receive measurable signals, especially when compared to the signal being provided by an antenna that is subsequently connected to the IC 205.

With reference now to FIG. 5, there is shown a diagram illustrating several different ways for testing ICs 205 on a semiconductor wafer 210, according to a preferred embodiment of the present invention. When the ICs 205 remain on the semiconductor wafer 210, a typical way to test the IC 205 is to use electrical probes that can be lowered onto the IC 205. The electrical probes can then be used to provide power to the IC 205 as well as provide connections to exchange information, data, and commands. The electrical probes can be arranged into a probe card 505 that can contain the required number of electrical probes to test one or more ICs 205.

If the ICs 205 to be tested are capable of self-powering, such as RFID tags deriving needed power from received RF transmissions, then an alternate way to test the ICs 205 can exist. Rather than using electrical probes to provide power and exchange information, data, and commands, an RF transceiver 510 can be used. Transmissions from the RF transceiver 510 can be used by the ICs 205 to derive needed power and the transmissions can be used to exchange information, data, and commands. Note that to receive and transmit RF signals, the ICs 205 will likely need an antenna, such as the antenna 305 (FIG. 3) fabricated in the scribe lines 220.

The RF transceiver 510 can transmit to all ICs 205 on the semiconductor wafer 210 (commonly referred to as a broadcast), transmit to multiple ICs 205 on the semiconductor wafer 210 (commonly referred to as a multi-cast), or transmit to a single IC 205 on the semiconductor wafer 210 (commonly referred to as a uni-cast). A broadcast can occur when the RF transceiver 510 makes a transmission without specifically identifying an intended recipient(s), while for a multi-cast or uni-cast, the transmission made by the RF transceiver 510 will contain unique identifiers that can be used to identify specific recipients. Note that details involved with the broadcast, multi-cast, and uni-cast are application specific and are beyond the scope of the present invention. For example, in a technical standard for RFID tags and readers entitled "ISO/IEC 18000 Information Technology AIDC Techniques—RFID for Item Management—Air Interface," a variety of air interfaces are disclosed, providing detailed discussion of matters such as broadcasting, multi-casting, uni-casting, collision detection and prevention, and so forth.

When the RF transceiver 510 is used in the testing of ICs 205, RF circuitry in the IC 205 is tested along with the non-RF circuitry in the ICs 205. The use of electrical probes only tests the non-RF circuitry in the ICs 205, while leaving the RF circuitry to be tested in an additional testing operation. The RF testing of the ICs 205 can be performed using specially designed probes that behave like transmission lines. These probes can be expensive, therefore, the RF testing of the ICs 205 can be prohibitively expensive in regards to low cost devices such as RFID tags.

Figures 6, 7:
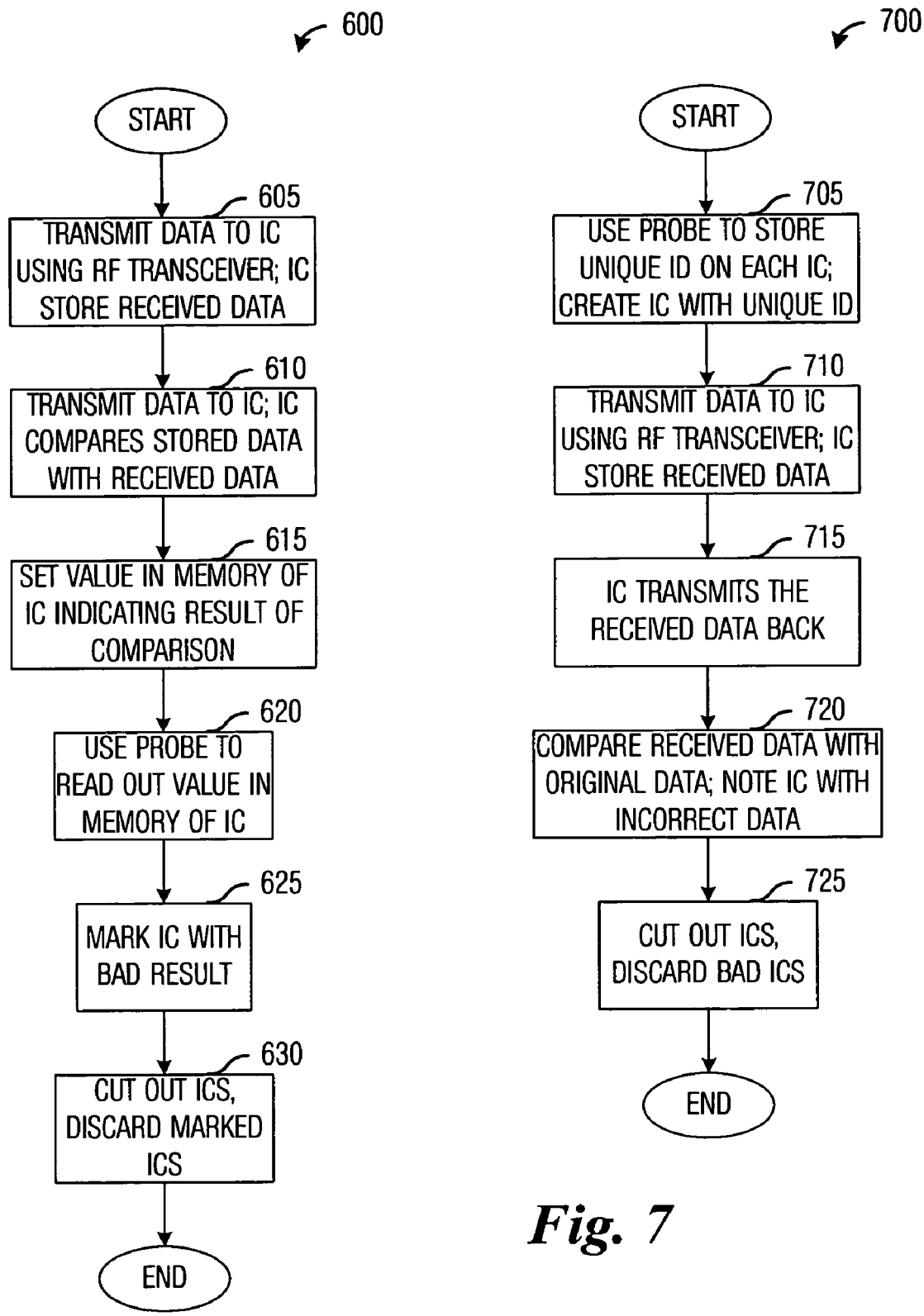
FIG. 6 is a diagram of a sequence of events in testing on-wafer integrated circuits using a radio-frequency transceiver, according to a preferred embodiment of the present invention.
FIG. 7 is a diagram of a sequence of events in testing on-wafer integrated circuits using a radio-frequency transceiver, according to a preferred embodiment of the present invention.

With reference now to FIG. 6, there is shown a flow diagram illustrating a sequence of events 600 for complete testing of ICs using an RF transceiver, according to a preferred embodiment of the present invention. The complete testing of the ICs 205 begins with a test system having an RF transceiver transmitting data to ICs 205 located on a semiconductor wafer 210 (block 605). Part of the transmission includes a command to have the ICs 205 store the received data in an internal memory (block 605). According to a preferred embodiment of the present invention, the transmission made by the RF transmitter can be a broadcast transmission and the data to be stored in IC memory can be provided to all of the ICs 205 on the semiconductor wafer 210 in a single transmission.

After the transmission completes, the test system can have the RF transceiver repeat the transmission of the data to the ICs 205 (block 610). However, rather than having the ICs 205 store the data in internal memory, the transmission includes a command to have the ICs 205 compare the data stored in internal memory with the data that they have just received (block 610). Each IC 205 then performs a comparison of the received data with the data stored in internal memory. If the two match, then the IC 205 is presumed to be operating properly and a specified memory location is set to a certain value to indicate that the IC 205 is a good IC (block 615). However, if the two does not match, then the IC 205 is presumed to be bad and the specified memory location is set of a certain value indicating that the IC 205 is a bad IC (block 615). Note that the intent is to determine if an IC is good or if it is bad, there is no intent to determine what particular portion of a bad IC is bad. This simple pass/fail approach to testing can enable the rapid and relatively inexpensive testing of a large number of ICs.

After the ICs 205 have compared the data stored in internal memory against the data that they have just received (block 610) and stored the result of the comparison in the specified memory location (block 615), electrical probes can be used to read out the value stored in the specified memory location (block 620). The use of electrical probes can enable the testing of ICs 205 on semiconductor wafers 210 that have not been assigned unique identifiers. Since the ICs 205 have not been assigned unique identifiers, it is not possible to determine which ICs 205 are good or bad using RF transmissions. However, if the ICs 205 are manufactured with each IC 205 having a unique identifier, then it is possible to use the RF transceiver to read the results from the ICs 205 on the semiconductor wafer 210 and not have to use the electrical probes. Note that if electrical probes are used to determine the good ICs 205, then during the use of the electrical probes, it can be possible to assign a unique identifier to each of the good ICs 205.

After reading out the value, the ICs 205 with the value indicating that the ICs 205 are bad can be marked (block 625). This can be followed by cutting the ICs 205 from the semiconductor wafer 210 and discarding the ICs 205 that are marked bad (block 630). Packaging of the good ICs 205 can then be complete and the ICs 205 can be ready for use.

With reference now to FIG. 7, there is shown a flow diagram illustrating a sequence of events 700 for complete testing of ICs 205 using an RF transceiver, according to a preferred embodiment of the present invention. The complete testing of the ICs 205 can begin with a testing system using electrical probes to store unique identifiers on each IC 205 (block 705). This results in each IC 205 on a semiconductor wafer 210 having a unique identifier (at least the ICs that are operable). Alternatively, the unique identifiers for each IC 205 may have been hardwired into the IC 205 in the design process. Then, as the ICs 205 are fabricated, each IC 205 in a semiconductor wafer 210 will have a unique identifier.

Then, an RF transceiver can be used to transmit data to the ICs 205 (block 710). According to a preferred embodiment of the present invention, although each IC 205 has a unique identifier, the transmission of the data occurs as a broadcast operation to reduce the amount of time required to provide data to the ICs 205. As the ICs 205 receives the transmitted data, the ICs 205 stores the data in internal memory (block 710).

Included as part of the transmission, a command to have the ICs 205 transmit the data stored in the internal memory back to the RF transceiver is executed by each of the ICs 205 (block 715). Since each IC 205 has a unique identifier, the RF transceiver can determine the source of each transmission. Note that an algorithm may need to be followed to ensure that the ICs 205 transmit in a proper fashion so that their transmissions simply do not interfere with one another. For example, in a technical standard for RFID tags and readers entitled "ISO/IEC 18000 Information Technology AIDC Techniques—RFID for Item Management—Air Interface," such algorithms are presented and discussed. As the RF transceiver receives the transmissions, the data carried in the transmissions can be provided to the test system where it can be compared with a copy of the originally transmitted data (block 720). Transmissions containing incorrect data (and its associated IC 205) can be duly noted by the test system (block 720) and marked as bad, then as the ICs 205 are cut from the semiconductor wafer 210, the bad ICs 205 can be discarded (block 725). Packaging of the good ICs 205 can then be complete and the ICs 205 can be ready for use.

Figure 8:
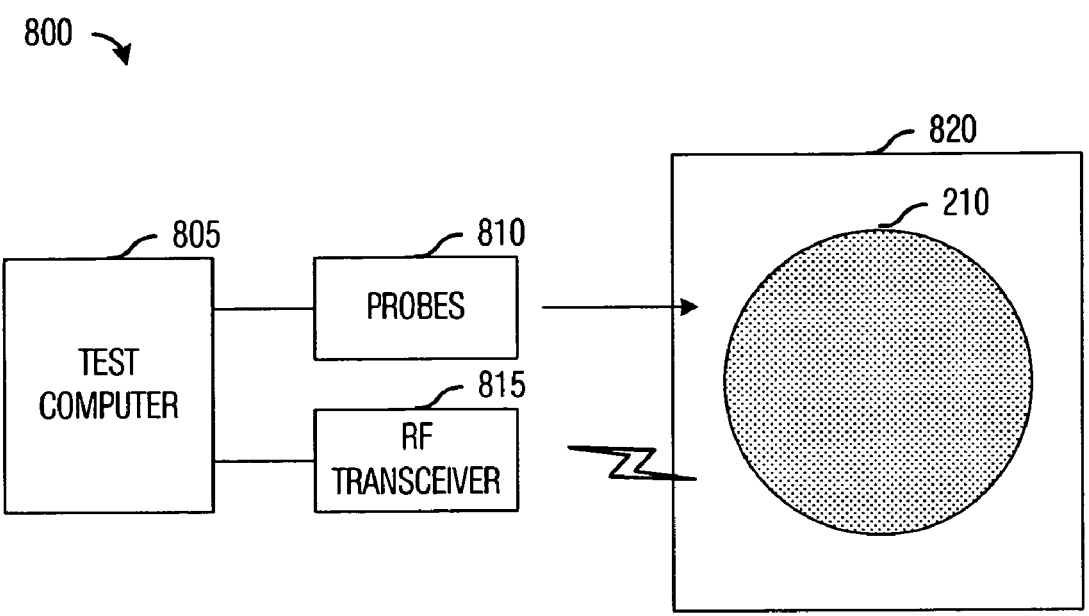
FIG. 8 is a diagram of a testing system, according to a preferred embodiment of the present invention.

With reference now to FIG. 8, there is shown a diagram illustrating a test system 800 for use in testing ICs 205 on a semiconductor wafer 210, wherein the ICs 205 are self-powered, according to a preferred embodiment of the present invention. The test system 800 displayed in FIG. 8 comprises a test computer 805 that can be used to execute a test program that controls the operation of equipment used in the testing as well as collect and process test data. The test system 800 can test ICs 205 on the semiconductor wafer 210 using either a set of electrical probes 810 and/or an RF transceiver 815, depending upon the nature of the test being performed. The semiconductor wafer 210 being tested can be held in position by a test fixture 820 to help ensure that the ICs 205 on the semiconductor wafer 210 are held in proper position.

When the set of electrical probes 810 is used, an actuator (not shown) can be used to move the set of electrical probes 810 into position. The electrical probes must be properly positioned to make proper contact with points in the ICs 205 to ensure that good electrical connections are made. When the RF transceiver 815 is used, no such positioning problems exist since electrical contact does not need to be achieved, rather, transmissions of RF signals can be exchanged between the test computer 805 and the ICs 205 and is sufficient to determine if the ICs 205 are good or bad.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for testing on-wafer integrated circuits (ICs), wherein each on-wafer IC contains an antenna and a memory, the method comprising:
   transmitting a first instruction and a first set of data to the on-wafer ICs, wherein the first instruction commands the on-wafer ICs to store the first set of data into the memory;
   transmitting a second instruction and a second set of data to the on-wafer ICs, wherein the first set of data and the second set of data are the same, and
   wherein the second instruction commands the on-wafer ICs to compare the second set of data with the first set of data stored in the memory;
   reading out results of the comparisons; and
   marking a status of each on-wafer IC based on the result of the comparison associated with the on-wafer IC being marked wherein the marking comprises marking the on-wafer IC defective if the comparison indicates that the first set of data differs from the second set of data.

2. The method of claim 1 further comprising after the marking, cutting out the on-wafer ICs and discarding the on-wafer ICs marked as defective.

3. The method of claim 1 further comprising, at each on-wafer IC, storing a result of the comparison to a specified memory location.

4. The method of claim 1, wherein the reading out comprises the use of electrical probes that make contact with input/output pads on each on-wafer IC to read out the result of the comparison.

5. The method of claim 4, wherein the reading out further comprises writing a unique identifier to each on-wafer IC.

6. The method of claim 1, wherein each on-wafer IC has a unique identifier, and wherein the reading out comprises, at each on-wafer IC, transmitting a result of the comparison.

7. The method of claim 6, wherein transmissions from each on-wafer is labeled with the unique identifier.

8. The method of claim 6, wherein the unique identifier is hardwired into each on-wafer IC.

9. A method for testing on-wafer integrated circuits (ICs), wherein each on-wafer IC contains an antenna and a memory, the method comprising:
   transmitting a first instruction and a set of data to the on-wafer ICs, wherein the first instruction commands the on-wafer ICs to store the set of data into memory;
   transmitting a transmit command to the on-wafer ICs;
   receiving the set of data from each on-wafer IC;
   comparing the set of data from each on-wafer IC with a copy of the set of data; and
   marking a status of each on-wafer IC based on the result of the comparison wherein an on-wafer IC is marked defective if the comparison of the set of data from the on-wafer IC and the copy of the set of data does not match, the method further comprising after the marking, cutting out the on-wafer ICs and discard the on-wafer ICs with a defective status.

10. The method of claim 9 further comprising prior to the first transmitting, writing a unique identifier to each on-wafer IC.

11. The method of claim 10, wherein the writing is performed during testing using electrical probes making contact with input/output pads on each on-wafer IC.

12. The method of claim 10, wherein the writing occurs during the manufacture of the on-wafer ICs.

13. The method of claim 9, wherein each on-wafer IC has a unique identifier, and wherein transmissions from each on-wafer IC is labeled with the unique identifier.

14. The method of claim 13, wherein transmissions from each on-wafer IC are made so that transmission collisions do not occur.

15. The method of claim 9, wherein the transmit command instructs each on-wafer IC to transmit the set of data stored in its memory.

* * * * *